US012696394B2

(12) United States Patent
Umemura et al.

(10) Patent No.: US 12,696,394 B2
(45) Date of Patent: Jul. 28, 2026

(54) WIRING SUBSTRATE

(71) Applicant: TOPPAN HOLDINGS INC., Tokyo (JP)

(72) Inventors: Yuki Umemura, Tokyo (JP); Takehisa Takada, Tokyo (JP); Tomoyuki Ishii, Tokyo (JP)

(73) Assignee: TOPPAN HOLDINGS INC., Tokyo (JP)

( * ) Notice: Subject to any disclaimer, the term of this patent is extended or adjusted under 35 U.S.C. 154(b) by 191 days.

(21) Appl. No.: 18/604,992

(22) Filed: Mar. 14, 2024

(65) Prior Publication Data

US 2024/0224426 A1 Jul. 4, 2024

Related U.S. Application Data

(63) Continuation of application No. PCT/JP2022/028287, filed on Jul. 21, 2022.

(30) Foreign Application Priority Data

Sep. 15, 2021 (JP) ................................. 2021-150441

(51) Int. Cl.
*H05K 1/00* (2006.01)
*H05K 1/03* (2006.01)
(Continued)

(52) U.S. Cl.
CPC ........... *H05K 1/162* (2013.01); *H05K 1/0306* (2013.01); *H05K 1/115* (2013.01); *H05K 2201/068* (2013.01); *H05K 2201/09536* (2013.01); *H05K 2201/0959* (2013.01); *H05K 2201/09827* (2013.01)

(58) Field of Classification Search
CPC ...... H05K 1/162; H05K 1/0306; H05K 1/115; H05K 2201/068; H05K 2201/09536; H05K 2201/0959; H05K 2201/09827
See application file for complete search history.

(56) References Cited

U.S. PATENT DOCUMENTS

2016/0064354 A1* 3/2016 Chadda ............... H01L 25/0652
257/528
2022/0053644 A1 2/2022 Chen et al.

FOREIGN PATENT DOCUMENTS

CN 112312654 A 2/2021
JP 2004-047667 A 2/2004
(Continued)

OTHER PUBLICATIONS

CN 112312654 A; published on Feb. 2, 2021 (Year: 2021).*
(Continued)

*Primary Examiner* — Pete T Lee
(74) *Attorney, Agent, or Firm* — Foley & Lardner LLP

(57) ABSTRACT

A component (capacitor) of the high-frequency circuit provided on a first surface of the glass substrate, and the bottom of the through hole in the glass substrate on the first surface have an overlapping part on the first surface. As a result, the capacitor is formed directly above the via, that is, the through hole, thereby eliminating the need for conductive wiring from the via to the capacitor. In addition, by forming a capacitor on a very flat glass substrate before forming the through hole, and forming the through hole after that, it is possible to stably form the capacitor.

10 Claims, 7 Drawing Sheets

(51) Int. Cl.
  *H05K 1/11*    (2006.01)
  *H05K 1/16*    (2006.01)

(56)       References Cited

FOREIGN PATENT DOCUMENTS

| | | |
|---|---|---|
| JP | 2004-111915 A | 4/2004 |
| JP | 2018-074134 A | 5/2018 |
| JP | 2019-106429 A | 6/2019 |
| JP | 2021-111699 A | 8/2021 |

OTHER PUBLICATIONS

International Searching Authority, "International Search Report," issued in connection with International Patent Application No. PCT/JP2022/028287, dated Oct. 11, 2022.

International Searching Authority, "Written Opinion," issued in connection with International Patent Application No. PCT/JP2022/028287, dated Oct. 11, 2022.

Office Action issued in corresponding Japanese Patent Application No. 2021-150441 dated Jul. 8, 2025.

* cited by examiner

WIRING SUBSTRATE

CROSS-REFERENCE TO RELATED PATENT APPLICATIONS

This application is a continuation application filed under 35 U.S.C. § 111(a) claiming the benefit under 35 U.S.C. §§ 120 and 365(c) of International Patent Application No. PCT/JP2022/028287, filed on Jul. 21, 2022, which is based upon and claims the benefit to Japanese Patent Application No. 2021-150441 filed on Sep. 15, 2021, the disclosures of which are incorporated herein by reference in their entirety.

TECHNICAL FIELD

The present invention relates to a wiring substrate.

BACKGROUND ART

In recent years, electronic devices have become more sophisticated and compact. Accordingly, there has been a demand for increasing the sophistication and density of wiring substrates mounted on the electronic devices as well.

For example, PTL 1 describes that, in order to increase the withstand voltage of a thin film capacitor formed on a glass substrate, "A high-frequency component includes a glass-containing substrate having a first surface on a first side and a second surface on a second side opposite to the first side, and a capacitor on the first surface of the substrate. The capacitor includes a first surface first conductive layer on the first surface of the substrate, a first surface first insulating layer on the first conductive layer, and a first surface second conductive layer 1 on the first surface first insulating layer. The first surface first insulating layer contains an inorganic material having an insulation breakdown electric field of 6 MV/cm or higher."

CITATION LIST

[Patent Literature] [PTL 1] JP 2018-74134A

SUMMARY OF THE INVENTION

Technical Problem

Generally, a high-frequency circuit formed on a glass substrate is often formed by utilizing part of a conduction layer connected to a through hole provided in the glass substrate. Therefore, parts forming the high-frequency circuit formed on a glass substrate may have unintended parasitic inductance or parasitic resistance. These parasitic components may deteriorate the filter characteristics of the resonant circuit.

However, PTL 1 does not consider this.

An object of the present invention is to provide a technique that can reduce parasitic inductance and parasitic resistance in components forming a high-frequency circuit formed on a glass substrate.

Solution to Problem

In order to solve the above problems, one of the typical wiring substrates of the present invention is a wiring substrate including a glass substrate having a through hole and a component forming a high-frequency circuit on a first surface of the glass substrate, characterized in that a bottom of the through hole on the first surface and the component forming the high-frequency circuit have an overlapping part on the first surface.

Advantageous Effects of the Invention

According to the present invention, a technique that can reduce parasitic inductance and parasitic resistance in components forming a high-frequency circuit formed on a glass substrate can be provided.

Problems, configurations, and effects other than those described above will be made clear by the following description of an embodiment.

DETAILED DESCRIPTION

Description of the Embodiments

Figure 1:
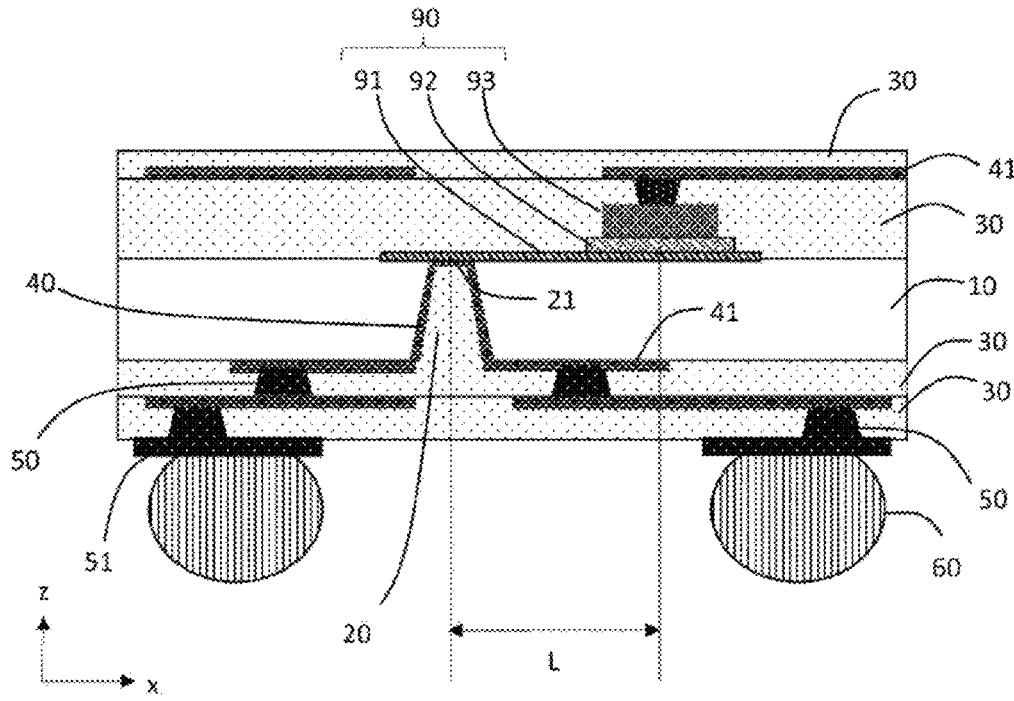
FIG. 1 is a schematic diagram of the cross-sectional structure of a conventional wiring substrate.

With reference to the drawings, an embodiment of the present invention will be described. The present invention is not limited to this embodiment. In the following description of the drawings, components identical with each other are given the same reference signs.

When there are two or more components having the same or similar functions, they may be denoted by the same reference sign but with different suffixes for explanation. These components may be described without the suffixes when there is no need to distinguish them.

The position, size, shape, extent, and the like of each component shown in the drawings may not represent their actual position, size, shape, extent, and the like to facilitate understanding of the invention. Therefore, the present invention is not necessarily limited to the positions, sizes, shapes, extent, and the like shown in the drawings.

Note that in the present disclosure, the term "glass substrate" may also be referred to as a glass core substrate, and includes glass substrates on which a metal layer, dielectric layer, insulating layer, and/or the like are deposited.

The glass substrate typically transmits light, and the materials of the glass material of the glass substrate and their mixture ratio are not particularly limited. The glass substrate can be made, for example, from glass having silicate as the main component, such as alkali-free glass, alkali glass, borosilicate glass, quartz glass, sapphire glass, or photosensitive glass.

From the perspective that the glass substrate 10 is used in semiconductor packages and semiconductor modules, alkali-free glass is desirably used. The content of alkali components in the alkali-free glass is preferably 0.1% by mass or less.

The thickness of the glass substrate is preferably 1 mm or less. The thickness of the glass substrate is more preferably within the range of 0.1 mm or more and 0.8 mm or less, in consideration of ease of handling during manufacture.

In the present disclosure, the term "components forming a high-frequency circuit" refer to components forming an electronic circuit intended to be used with high-frequency signals at 0.1 GHz or higher, including capacitors and inductors.

In the present disclosure, the term "have an overlapping part on a surface" means that, when the surface is viewed in the normal direction of the surface, there is a two-dimensionally overlapping part. This also includes one area being completely included in the other area, as well as the two areas completely overlapping.

In the present disclosure, the term "through hole" refers to a hole that extends approximately from a first surface of the glass substrate to a second surface opposite to the first surface. It does not necessarily completely extend from the first surface of the glass substrate to the second surface. After the through hole is formed, it may be filled with a conductive material, or a conductive layer may be formed on the inner wall of the hole, and an insulating material such as resin may be filled in the center part of the hole.

The shape of a cross section of the through hole formed in the glass substrate may be a rectangle, an X shape in which the diameter of the center part of the through hole is smaller than that at a first end and a second end, a tapered shape in which the bottom diameter of the through hole is smaller than the diameter at the first end, an O shape in which the diameter of the center part of the through hole is larger than the diameter at the first end and the diameter at the second, or any other shape. Moreover, the shape of the openings of the through hole in the first and second surfaces may be a circle, an oval, or a polygon.

The "bottom" of a through hole refers to the surface where the through hole or the conductive film or insulating film in contact with the through hole contacts the first or second surface of the glass substrate.

When the through hole has a tapered cross section, the end with the smaller diameter may be referred to as "Bottom", and the end with the larger diameter may be referred to as "Top."

Prior Art

Next, the configuration of a conventional wiring substrate will be described with reference to FIG. 1. FIG. 1 is a schematic diagram of the cross-sectional structure of the conventional wiring substrate. In FIG. 1, a through hole 20 is formed in a glass substrate 10. A conductive layer 40 is formed on the side wall of the through hole, and an insulating resin is filled in the center part of the through hole 20. A bottom 21 of the through hole is connected to a conductive layer 91 formed on the surface of the glass substrate on the Z-axis positive side.

Together with an insulator 92 formed on the conductive layer 91 and a conductor 93, the conductive layer 91 forms an MIM (Metal-Insulator-Metal) capacitor 90. This capacitor 90 forms part of the LC filter and is a component of the high-frequency circuit.

The conductor 93 is connected to the wiring of the wiring substrate.

On the other hand, the conductive layer 40 on the side wall is connected to an internal wiring layer 41 formed on the surface of the glass substrate on the Z-axis negative side. The internal wiring layer 41 is connected to a via part 50 that is part of the wiring layer formed as a build-up layer on the glass substrate. The via part 50 is connected to a pad part 51 formed on the outer shell of the wiring layer, and solder balls 60 are placed on the pad part 51.

In the conventional example shown in FIG. 1, the bottom 21 of the through hole 20 and the capacitor, which is a component of the high-frequency circuit, do not have a two-dimensionally overlapping part when the surface of the wiring substrate is viewed from above in the z-axis. The center of the capacitor 90 is spaced from the center of the through hole by a distance of L.

As a result, due to the presence of the conductive layer 91 at the distance L, unintended parasitic inductance and parasitic resistance occur in the capacitor 90.

First Embodiment

Figure 2:
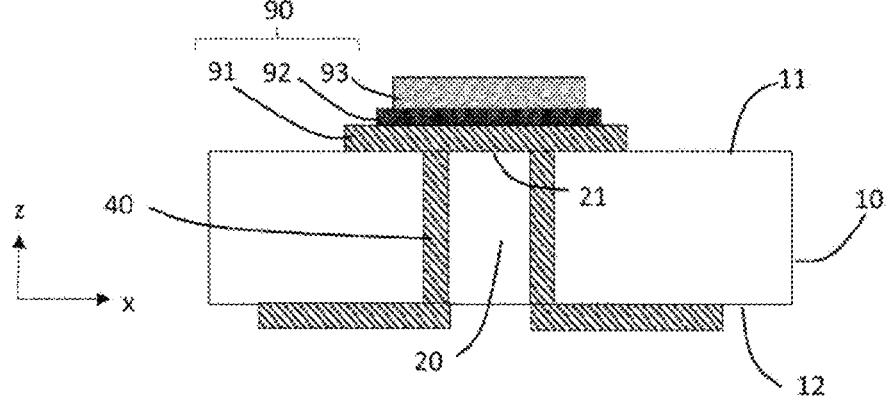
FIG. 2 is a schematic diagram of the cross-sectional structure of key parts of the first embodiment.

Next, with reference to FIG. 2, the configuration of the capacitor and through hole, which are main parts of the wiring substrate according to the first embodiment of the present disclosure, will be described. FIG. 1 is a schematic diagram of the cross-sectional structure of the conventional wiring substrate according to the first embodiment. In FIG. 2, the through hole 20 is formed in the glass substrate 10. The conductive layer 40 is formed on the side wall of the through hole.

In the first embodiment, the conductive layer 91, the insulator 92 formed thereon, and the conductor 93 form a MIM capacitor 90 in the z-axis positive direction of the through hole 20. In other words, the capacitor 90, which is a component of the high-frequency circuit provided on the first surface of the glass substrate 10, and the bottom 21 of the through hole in the glass substrate on the first surface have an overlapping part on the first surface.

As a result, the wiring distance from the bottom of the through hole to the capacitor 90 is shortened compared to the conventional example, so it is possible to prevent the occurrence of parasitic inductance and parasitic resistance and improve the performance of the high-frequency circuit.

Further, on the first surface of the glass substrate, there is no need to secure an area for forming the wiring from the bottom of the through hole to the capacitor 90, which allows the wiring substrate to have an increased density.

Although in the schematic diagram shown in FIG. 2 the center position of the through hole 20 on the first surface of the glass substrate and the center position of the capacitor 90 almost overlap, these center positions do not necessarily have to coincide. By forming the bottom 21 of the through hole 20 and the conductive layer 91 of the capacitor 90 so that they overlap, it is possible to sufficiently reduce the parasitic inductance and parasitic resistance in the components constituting the high frequency circuit as compared to the conventional example.

Further, in FIG. 2, the through hole 20 is formed with the conductive layer 40 only on its side wall and is described as a conformal via. However, the through hole 20 does not necessarily have to be a conformal via, and may be configured as a filled via by completely filling the through hole 20 with a conductor.

Next, with reference to FIG. 3, an example where the capacitor and through hole of the first embodiment are applied to a wiring substrate will be described. In the following description, components that are the same as or similar to those of the first embodiment are given the same reference signs, and will not be described in detail or at all.

Figure 3:
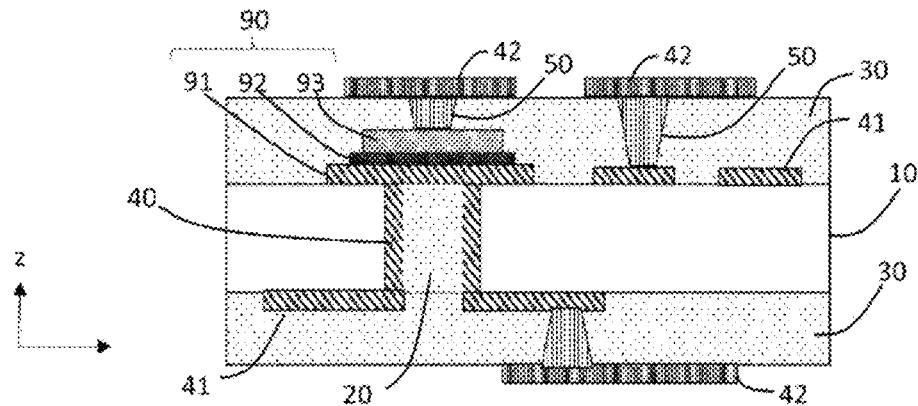
FIG. 3 is a schematic diagram of the cross-sectional structure of a wiring substrate according to the first embodiment.

In FIG. 3, the conductive layer 40 is formed on the side wall of the through hole 20, and the center part thereof is filled with an insulating material such as resin. In this case, it is desirable that the coefficient of thermal expansion (CTE) of the material filled in the through hole 20 is 40 ppm/K or lower, more preferably 30 ppm/K or lower, and even more preferably 20 ppm/K or lower. By employing such a configuration, as will be described later, it is possible to suppress changes in the capacitance of the capacitor with respect to changes in the temperature of the wiring substrate.

Further, in the example of FIG. 3, as in the case of the conventional example, the capacitor is connected to external wiring 42 through the via part 50 provided by forming an opening in the insulating layer 30 for the conductor 93 forming part of the capacitor. The conductive layer 40 formed on the side wall of the through hole 20 is also connected to external wiring 42 formed on the wiring substrate through the internal wiring layer 41, a via part 50, and the like.

Note that, except for the positional relationship between the capacitor 90 and the through hole 20, the configuration and manufacturing method of the wiring substrate described above are not limited to the configuration described above and can be changed as appropriate.

Second Embodiment

Figure 4:
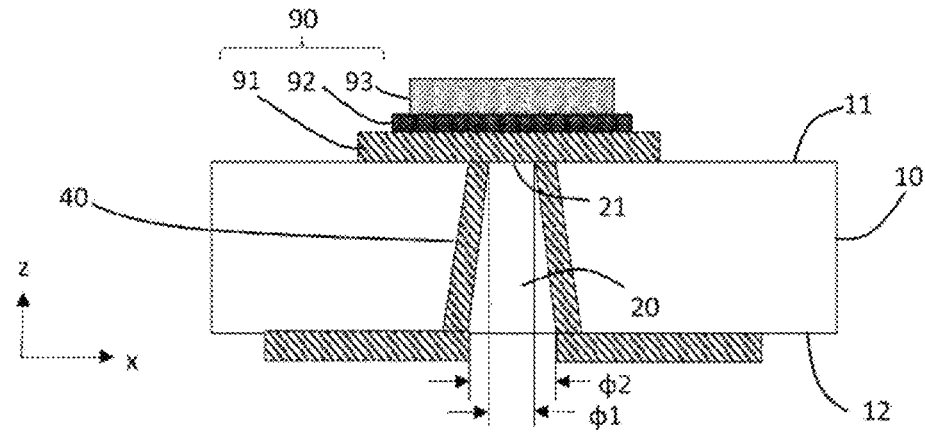
FIG. 4 is a schematic diagram of the cross-sectional structure of key parts of the second embodiment.

Next, with reference to FIG. 4, the configuration of the capacitor and through hole, which are main parts of the wiring substrate according to the second embodiment of the present disclosure, will be described. FIG. 4 is a schematic diagram of the cross-sectional structure of the conventional wiring substrate according to the second embodiment. In the following description, components that are the same as or similar to those of the first embodiment are given the same reference signs, and will not be described in detail or at all.

The second embodiment differs from the first embodiment in that the through hole 20 is tapered so that its diameter decreases in the z-axis direction. That is, in the second embodiment, a diameter φ1 of the bottom 21 of the through hole 20 overlapping the capacitor 90 is smaller than a diameter φ2 at the second surface 12 on the opposite side of the glass substrate. By providing the capacitor 90 on the side of the through hole 20 with a smaller diameter, it is possible to suppress changes in the capacitance of the capacitor with respect to changes in the temperature of the wiring substrate.

Next, the effect of suppressing changes in the capacitance of the capacitor 90 with respect to changes in the temperature of the wiring substrate by providing the capacitor on the side of the through hole 20 with a smaller diameter will be described with reference to FIGS. 5A, 5B, 5C, and 6.

6

Figure 5A:
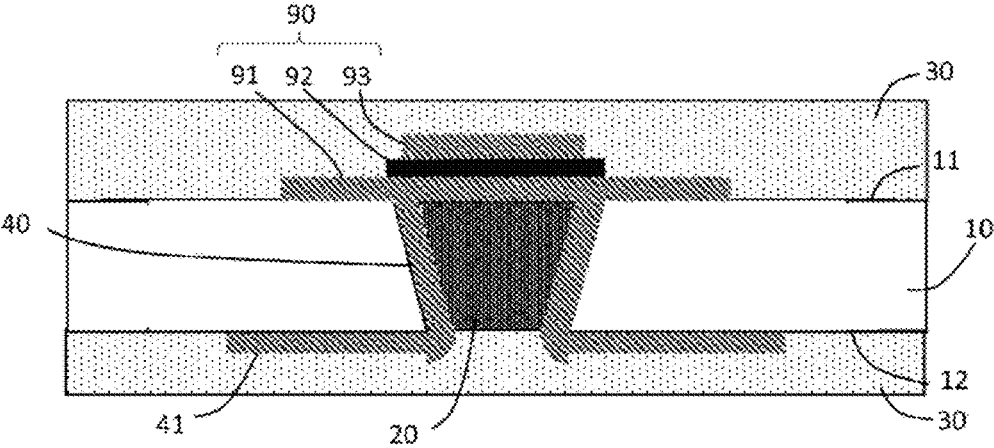
FIG. 5A is a cross-sectional view schematically showing the shape of a capacitor at room temperature.
Figure 5B:
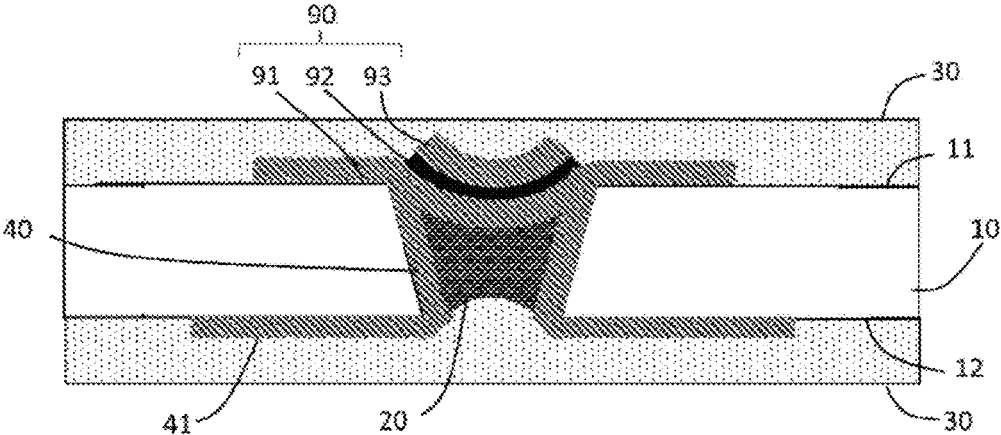
FIG. 5B is a cross-sectional view schematically showing the shape of the capacitor at low temperature.
Figure 5C:
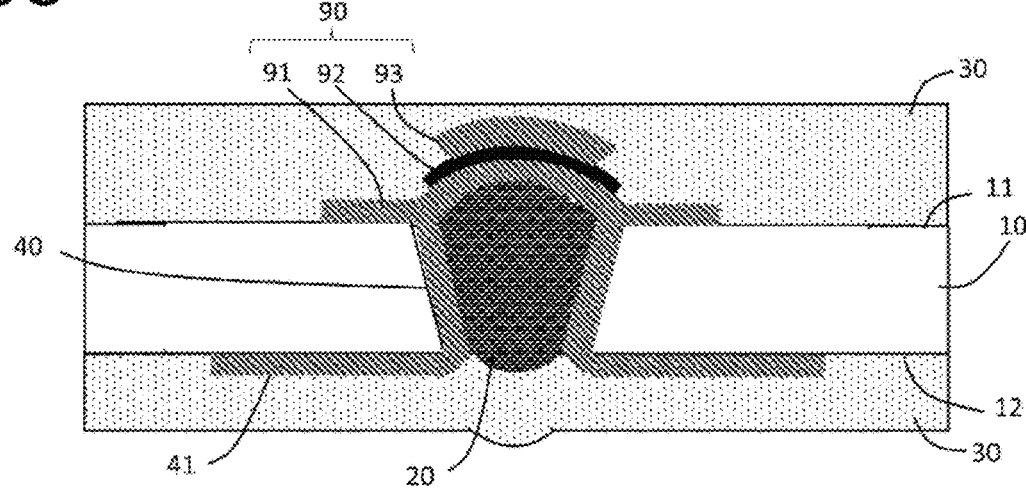
FIG. 5C is a cross-sectional view schematically showing the shape of the capacitor at high temperature.

FIGS. 5A, 5B, and 5C are each a cross-sectional view schematically showing deformation of the capacitor due to temperature change when the capacitor 90 is provided on the larger diameter side (Top) of the through hole 20.

When the components of the high-frequency circuit provided on the first surface 11 of the glass substrate have an overlapping part with the bottom of the through hole 20 in the glass substrate on the first surface 11, deformation of the through hole 20 due to temperature change causes the capacitor 90 to deform. This may affect the capacitance of the capacitor.

FIG. 5A shows the shapes of the through hole 20 and the capacitor 90 at room temperature, and no deformation is observed in the capacitor 90.

However, the thermal expansion coefficients and elastic moduli of the glass substrate 10 and the internal wiring layer 41, the material of the conductive layer 91, and the insulating layer are significantly different. For example, glass has a coefficient of thermal expansion (CTE) of approximately 3 to 10 ppm/K and an elastic modulus of 60 GPa to 100 GPa, whereas copper used in a wiring layer or conductive layer has a coefficient of thermal expansion of approximately 16 ppm/K and an elastic modulus of 80 GPa, and the insulating resin layer has a thermal expansion coefficient of 10 to 60 ppm/K and an elastic modulus of about 1 to 20 GPa.

In other words, glass deforms less due to temperature changes and has a smaller coefficient of thermal expansion than other materials, so when there is a temperature change, the differences in the coefficient of thermal expansion and contraction between glass and the neighboring other materials tend to cause structural deformation.

Therefore, when the components of the high-frequency circuit provided on the first surface 11 of the glass substrate, and the bottom 21 of the through hole 20 in the glass substrate have an overlapping part on the first surface 11, the capacitor 90 forming a part of the high-frequency circuit may deform. The magnitude of this deformation also changes depending on the substance filled in the through hole 20.

FIG. 5B schematically shows the structure when the wiring substrate has contracted at low temperature. FIG. 5C schematically shows the structure when the wiring substrate has expanded at high temperature.

Therefore, it is desirable that the coefficient of thermal expansion (CTE) of the material filled in the through hole 20 is close to that of the glass substrate, and it is preferably 40 ppm/K or lower, more preferably 30 ppm/K or lower, and even more preferably 20 ppm/K or lower.

When it is 40 ppm/K or lower, the change in capacitance can be suppressed to the extent that it can withstand general use. When it is 30 ppm/K or lower, it can be used in applications where control of capacitance changes is required. When it is 20 ppm/K or lower, it can be used in applications where capacitance changes need to be controlled more strictly.

Examples of materials that meet these requirements are listed below.

Material Examples 40 ppm or lower ABF-GX92 (Ajinomoto Fine-Techno Co., Inc.)
30 ppm or lower NX04 series (Sekisui Chemical Company, Limited)
ABF-GXT31 (Ajinomoto Fine-Techno Co., Inc.)
20 ppm or lower ABF-GL102, 103 (Ajinomoto Fine-Techno Co., Inc.)

GX-E4 (Ajinomoto Fine-Techno Co., Inc.)

The CTE measurement was carried out by a TMA (tensile tester) 25° ° C. to 150° C.

Next, a comparison of the deformations of capacitors due to temperature change when the capacitors 90 are provided on the smaller diameter side (bottom) of the through holes 20 will be described with reference to FIG. 6.

Figure 6:
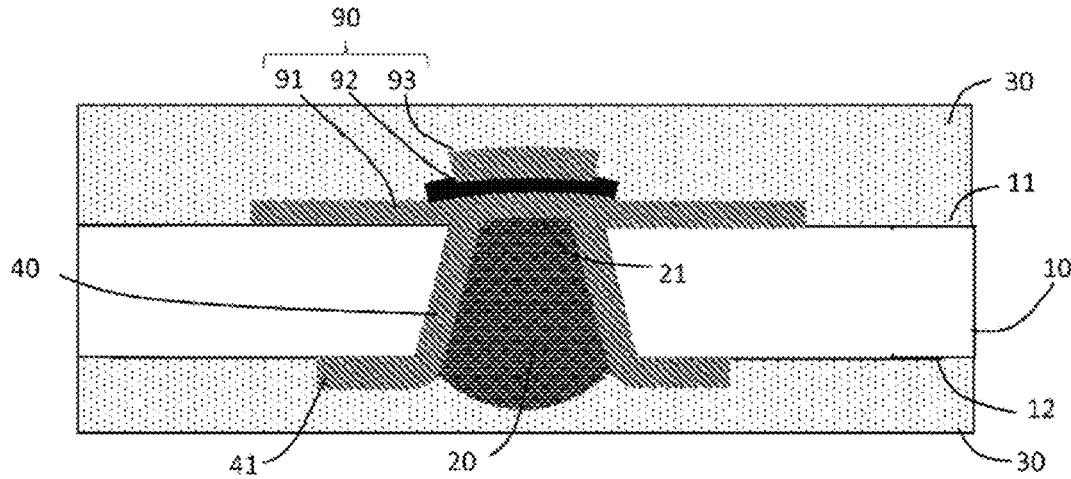
FIG. 6 is a cross-sectional view schematically showing deformation of the capacitor at high temperature.

FIGS. 5A, 5B, and 5C show temperature changes when the capacitor 90 is provided on the larger diameter side (Top) of the through hole 20, whereas FIG. 6 shows the deformation at high temperature when the capacitor 90 is provided on the smaller diameter side (Bottom) of the through hole 20.

That is, FIGS. 5C and 6 show the difference in the amount of deformation at high temperature between when the capacitor 90 is provided on the larger diameter side (Top) of the through hole (FIG. 5C) and when the capacitor 90 is provided on the smaller diameter side (Bottom) of the through hole (FIG. 6).

As is clear from this result, the structure (FIG. 6) in which the capacitor is formed on the smaller diameter surface (bottom) of the through hole 20 can reduce the deformation of the capacitor due to temperature changes more and thus reduce the change in the capacitance of the capacitor.

For example, when the materials are expanded at a high temperature, the CTEs of glass, Cu, and resin are about 3 ppm, 16 ppm, and 20 ppm, respectively. This means that the materials inside the through hole 20 expand more than the glass, but by forming the capacitor 90 on the smaller diameter surface of the through hole 20, the influence can be minimized.

In other words, when the structure shown in FIG. 6 is adopted, the insulating material tends to expand toward the second surface 12 opposite to the surface on which the capacitor is formed. As a result, the bottom 21 of the through hole deforms less, and the capacitance change can be reduced.

Third Embodiment

Figure 7:
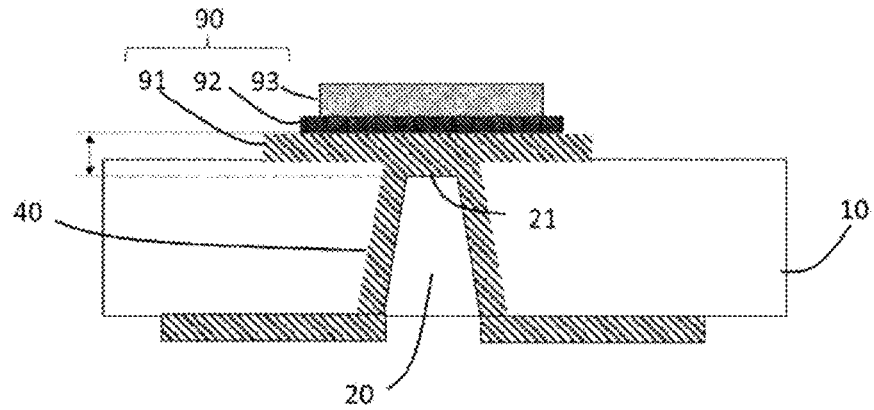
FIG. 7 is a schematic diagram of the cross-sectional structure of a wiring substrate according to the third embodiment.

A third embodiment of the present invention will be described with reference to FIG. 7. FIG. 7 is a schematic diagram of the cross-sectional structure of the conventional wiring substrate according to the third embodiment. In the following description, components that are the same as or similar to those of the first or second embodiment are given the same reference signs, and will not be described in detail or at all.

The third embodiment is the same as the second embodiment in that the through hole 20 is tapered so that its diameter decreases in the z-axis direction, and the capacitor 90 is formed on the smaller diameter surface of the through hole 20. The third embodiment differs from the second embodiment in that the part of the conductive layer 91 at the bottom 21 of the through hole is thicker than the other part of the conductive layer 91 that does not overlap with the bottom 21.

In other words, the part of the conductive layer 91 in contact with the first surface of the capacitor 90, which is a component of the high-frequency circuit, has a larger conductive layer thickness at the bottom 21 of the through hole than the other part that does not overlap with the through hole.

The bottom 21 is susceptible to greater stress and strain caused by thermal expansion than other locations, but in the third embodiment, by increasing the thickness of the part of the conductive film at the bottom 21, it is possible to further reduce the amount of deformation of the capacitor 90 due to thermal expansion and thus further improve the performance of the capacitor as a high-frequency component.

Production Method

Next, with reference to FIGS. 8A-8E, a manufacturing method of the wiring substrate of the present disclosure will be described.

(Step 1)

Figure 8A:
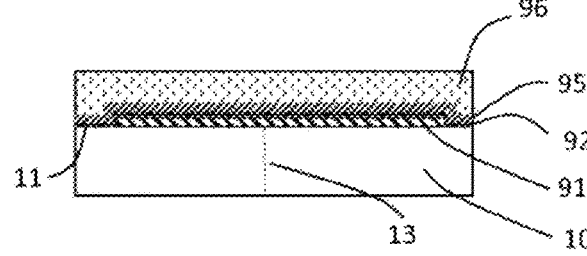
FIGS. 8A-8E are diagrams describing a method of manufacturing a wiring substrate.

First, as shown in FIG. 8A, an alkali-free glass (EN-A1, AGC Inc.) with a thickness of 500 μm is prepared as the glass substrate 10, and contaminants on the surface are removed by ultrasonic cleaning or the like.

Then, the glass substrate is irradiated with laser light on the first surface to form a laser modified area 13 which is a starting point of a through hole. The laser modified area 13 is formed in a manner to extend downward from the first surface 11, for example, in a vertical direction, with its lower end within the glass substrate 10.

(Step 2)

A hydrofluoric acid-resistant metal film (with a thickness of 10 nm or greater and 500 nm or smaller) is formed on the first surface 11 of the glass substrate by sputtering or the like. Then, a copper film (with a thickness of 100 nm or greater and 500 nm or smaller) that forms part of the conductive layer 91 is formed on the hydrofluoric acid-resistant metal film by sputtering, electroless plating, or the like. A seed layer for electrolytic plating is thus formed on the first surface of the glass substrate. The material for the hydrofluoric acid resistant metal film can be selected as appropriate from, for example, chromium, nickel, and nickel-chromium.

(Step 3)

Next, a photoresist for pattern formation is formed on the seed layer. Specifically, a dry photoresist (RD1225) manufactured by Showa Denko Materials Co., Ltd. is used for lamination on the first surface 11 side. The seed layer is then exposed by pattern writing and development. Power is supplied to the seed layer to perform electrolytic copper plating, thereby forming a pattern of the conductive layer 91 having a thickness of 2 μm or greater and 10 μm or less. The pattern of the conductive layer 91 can then be used as the lower electrode of the capacitor.

Note that the dry film resist that is no longer needed after plating is dissolved and peeled off.

(Step 4)

In the next step, a dielectric film as the insulator 92 is formed on the pattern of the conductive layer 91. Any known method can be used to form the dielectric film, and for example, SiN, SiO2, TaOx, or the like can be formed by plasma CVD.

(Step 5)

In the next step, the upper electrode of the capacitor is formed on the dielectric film. First, a copper film 95 (Cu, Ti/Cu) or the like with a thickness of 100 nm or greater and 500 nm or less is formed on the dielectric film by sputtering, electroless plating, or the like. Then, a dry film resist 96 is used for lamination on the first surface side.

(Step 6)

Figure 8B:
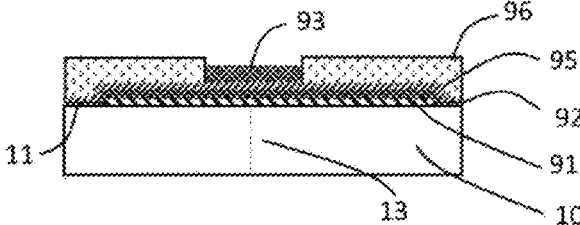

Next, as shown in FIG. 8B, after writing a pattern in the dry film resist 96, it is developed to expose the copper film 95 serving as the seed layer. Power is supplied to the seed layer to perform electrolytic copper plating and form an upper electrode (conductor 93) with a thickness of 2 μm or greater and 10 μm or smaller.

(Step 7)

Figure 8C:
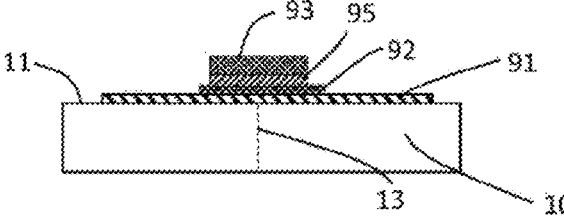

Next, as shown in FIG. 8C, the upper electrode seed layer, dielectric, lower electrode seed layer, and hydrofluoric acid-resistant metal film are etched using the conductor 93 as an etching mask.

Cu can be removed by wet etching, the dielectric can be removed by dry etching, and Ti can be removed by dry and wet etching. Further, the hydrofluoric acid-resistant metal film can also be etched with an etching solution suitable for a metal film. Known etching techniques can be employed as appropriate for these.

(Step 8)

Figure 8D:
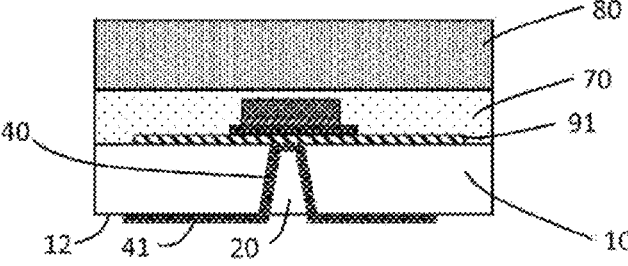

Next, as shown in FIG. 8D, an insulating resin 70 (ABF-GL103 manufactured by Ajinomoto Fine-Techno Co., Inc., thickness 32.5 μm) is laminated on the capacitor and wiring.

After that, in order to attach a glass carrier 80, an adhesive for temporary attachment (REVALPHA manufactured by Nitto Denko Corporation) is formed on the insulating resin 70, and the glass carrier is attached.

The glass carrier desirably has a thickness within the range of 0.7 mm to 1.5 mm in view of the conveyance after being thinned. However, the thickness of the glass carrier may be determined as appropriate in accordance with the thickness of the glass substrate.

Although the glass carrier is illustrated as the support body in the present disclosure, the support body may not be glass, but may be metal or resin.

(Step 9)

Next, etching is performed using a hydrogen fluoride solution on the surface of the glass substrate opposite to the first surface 11 to form through holes and thin the glass substrate 10.

By this method, the glass area outside the laser modified area 13 is etched by the hydrogen fluoride solution and thinned in parallel with the first surface of the glass substrate. When the hydrogen fluoride solution comes into contact with the laser modified area 13, the laser modified area is dissolved preferentially, and thus the through hole 20 is formed. In this manner, the glass substrate is thinned while the through hole is being formed. That is, thinning and the formation of the through hole are performed in a single etching. The bottom surface of the thinned glass substrate is a second surface 12 on which a second-surface wiring layer s formed.

An etching amount of the hydrogen fluoride solution can be determined as appropriate in accordance with the thickness of the glass device. For example, if the glass substrate used at step 1 has a thickness of 400 μm, the etching amount may desirably be 100 μm or more and 350 μm or less.

The thinned glass substrate preferably has a thickness of 50 μm or more and 300 μm or less.

By etching the glass substrate 10 from one side thereof in this way, the capacitor 90 can be obtained on the smaller diameter side of the through hole 20 as shown in the second embodiment.

(Step 10)

Next, on the second surface 12 of the glass substrate, a copper coating or the like with a thickness of 100 nm or greater and 500 nm or less is formed by sputtering, electroless plating, or the like as the conductive layer 40 on the side wall and bottom of the through hole 20. A seed layer is thus formed on the second surface 12 of the glass substrate.

(Step 11)

As in step 3, a pattern is formed on the second surface 12 using a dry film resist, power is supplied to the seed layer, and electrolytic plating is performed so that a conductive film having a thickness of 2 μm or greater and 10 μm or less is formed.

Note that by controlling this electrolytic plating process, it is possible to make the thickness of the part of the conductive layer 91 at the bottom 21 of the through hole greater than the thickness of the other part of the conductive layer 91 that does not overlap with the bottom 21 as in the third embodiment.

Next, the dry film resist no longer needed is dissolved away to form a through electrode. Then, the seed layer no longer needed is removed, and the surface is coated with an outer layer protective film such as an insulating resin or a solder resist layer to form the internal wiring layer 41 on the second surface 12.

(Step 12)

Figure 8E:
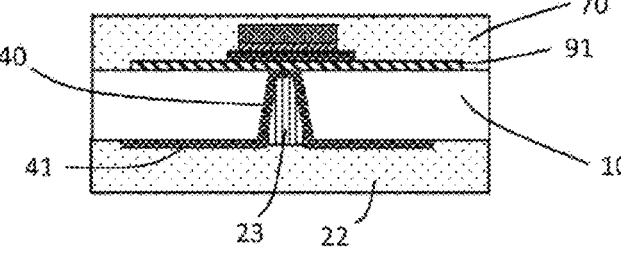

Next, as shown in FIG. 8E, the through hole 20 is filled with a filling material 23 such as an insulating resin. After that, an interlayer insulating layer 22 covering the second surface 12 is formed.

Note that the filling material 23 filling the through hole 20 may be the same as or different from the material of the interlayer insulating layer 22. For example, filling the through hole may be done by filling only the through hole 20 with a soft resin by a printing method and curing the resin, and then forming the interlayer insulating resin, or by continuously performing filling of the through hole 20 and formation of the interlayer insulating layer in a single step.

The filling material 23 is not limited to insulating resin, and a metal material may be used as the filing material such as Cu plating.

The glass carrier 80 temporarily attached in step 8 is removed.

(Step 13)

After that, wirings and build-up layers can be formed on the front and back surfaces as in FC-BGA substrates using known manufacturing methods, and inductors (coils) (not shown) can be formed at the same time as wiring formation. Regarding the structure of the inductors, a coil of a desired shape can be formed such as a solenoid or spiral.

According to the manufacturing method of the present disclosure, since the capacitor can be manufactured on the first surface of the glass substrate that is very flat before forming the through hole 20, the capacitor can be formed with high precision.

In addition, the diameter φ1 of the bottom 21 of the through hole 20 overlapping the capacitor 90 is smaller than the diameter φ2 on the second surface 12 on the opposite side of the glass substrate. By providing the capacitor 90 on the side of the through hole 20 with a smaller diameter, it is possible to suppress changes in the capacitance of the capacitor with respect to changes in the temperature of the wiring substrate.

Verification of Effects

Next, with reference to FIGS. 9 to 12, the reflection characteristics (S11) of the high-frequency circuit will be explained by comparing a wiring substrate employing the key parts of the wiring substrate according to the second embodiment of the present disclosure with the wiring substrate of a comparative example.

Figure 9:
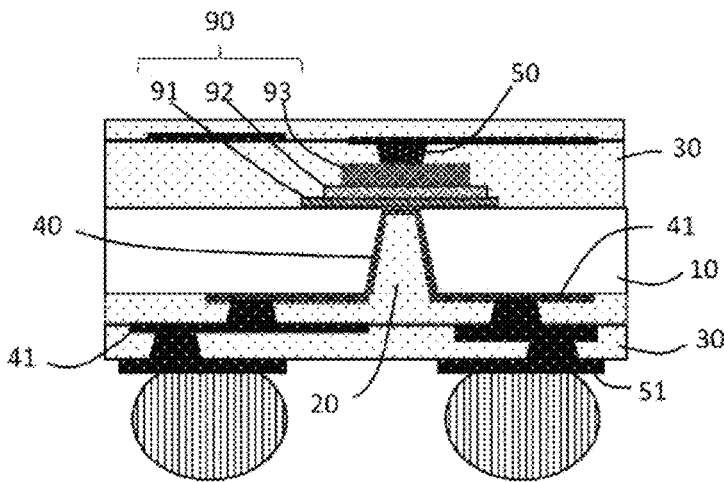
FIG. 9 is a schematic diagram of the cross-sectional structure of the wiring substrate of the present disclosure.

FIG. 9 is a schematic diagram of the cross-sectional structure of a wiring substrate employing the key parts of the wiring substrate according to the second embodiment of the present disclosure. In the following description, components that are the same as or similar to those of the first or second embodiment are given the same reference signs, and will not be described in detail or at all.

Specifically, alkali-free glass (EN-A1 (AGC) with a thickness of 0.15 mm) was used as the glass substrate 10, and GL103 (Ajinomoto Fine-Techno Co., Inc.) was used as the interlayer insulation resin and through-hole filling material. Electrolytic copper plating was used as the conductive layer, and SiN was used as the capacitor dielectric. In the example of FIG. 9, the diameters of the through hole are Top: 80 μm and Bottom: 50 μm, and the capacitor is located on the Bottom side and right above the through hole.

Figure 10:
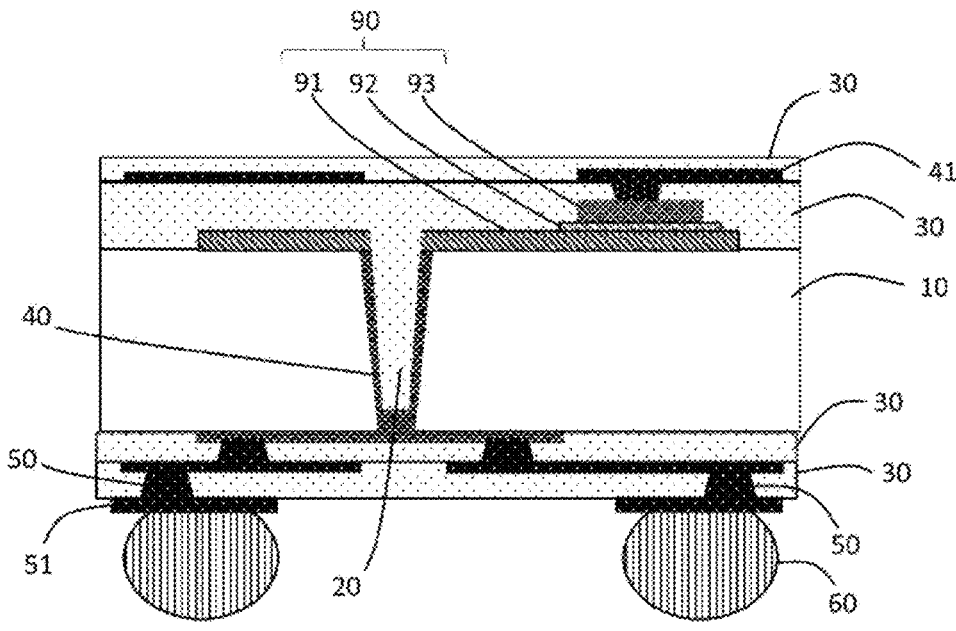
FIG. 10 is a schematic diagram of the cross-sectional structure of a wiring substrate of a comparative example.

In contrast, FIG. 10 is a schematic diagram of the cross-sectional structure of a wiring substrate employing the key parts of the wiring substrate according to a comparative example. In the following description, components that are the same as or similar to those of the conventional example or the first or second embodiment described above are given the same reference signs, and will not be described in detail or at all.

The wiring substrate of the comparative example has a capacitor formed on a glass substrate formed with a through hole. It is not provided with the laser modified area adopted in the present disclosure and does not adopt the method of simultaneously forming the through hole and thinning the glass substrate. Therefore, the glass substrate is thicker than that shown in FIG. 9.

With regard to other specific elements, alkali-free glass (EN-A1 (AGC) with a thickness of 0.15 mm) was used as the glass substrate 10, and GX13 (Ajinomoto Fine-Techno Co., Inc.) was used as the interlayer insulation resin and through-hole filling material. Electrolytic copper plating was used as the conductive layer, and SiN was used as the capacitor dielectric. The diameters of the through hole are Top: 80 μm and Bottom: 50 μm, and the capacitor is located at a distance of 500 μm from the Top side of the through hole.

Figure 11:
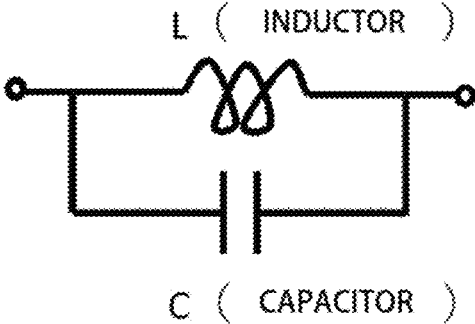
FIG. 11 is a resonant circuit diagram used to verify effects.

Although an inductor as a component of the high-frequency circuit is not shown in FIGS. 9 and 10, parallel resonant circuits including an inductor and a capacitor as shown in FIG. 11 were prepared using the circuit boards of FIGS. 9 and 10. The S-parameter (S11 reflection characteristics) was measured using a network analyzer and the results were compared.

The following sets forth the measurement method.
Measurement device: Network analyzer (N5225B)
Measurement frequency range: 100 MHz to 10 GHz
Calibration: SOL calibration
Measurement method: Reflection method (1 port)
Measurement probe: SG/GS 200

Figure 12:
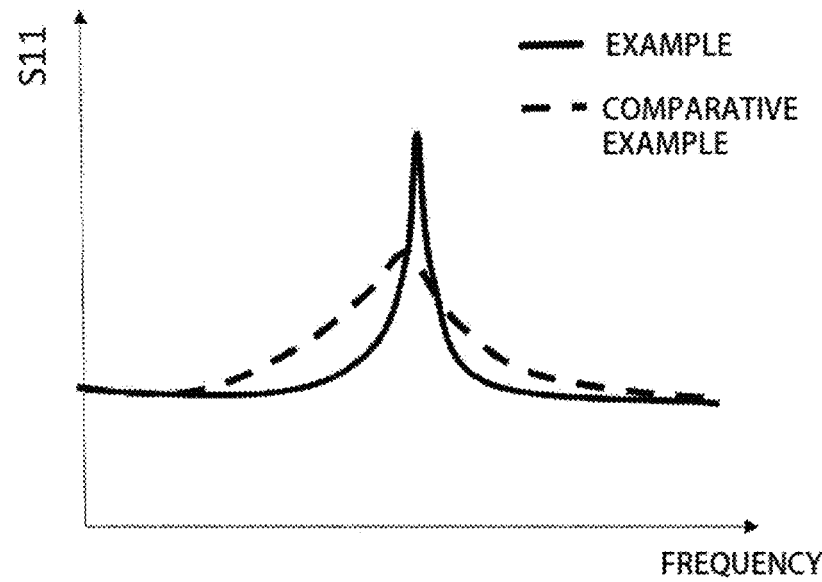
FIG. 12 is a diagram showing frequency characteristics of an example of the present disclosure and frequency characteristics of the comparative example.

As a result, an S11 waveform as shown in FIG. 12 could be obtained. It can be seen that the example of the present disclosure has steeper and better frequency characteristics than the comparative example.

An embodiment of the present invention has been described in the foregoing. The present invention should not be construed as limited to the embodiment and many alterations may be possible within the range not departing from the gist of the present invention.

REFERENCE SIGNS LIST

10 . . . Glass substrate; 11 . . . First surface; 12 . . . Second surface; 13 . . . Laser modified area; 20 . . . Through hole; 21 . . . Bottom; 22 . . . Interlayer insulating layer; 23 . . . Filling material; 30 . . . Insulating layer; 40 . . . Conductive layer; 41 . . . Internal wiring layer; 42 . . . External wiring; 50 . . . Via part; 51 . . . Pad part; 60 . . . Solder ball; 70 . . . Insulating resin; 80 . . . Glass carrier; 90 . . . Capacitor; 91 . . . Conductive layer; 92 . . . Insulator; 93 . . . Conductor; 94 . . . Hydrofluoric acid resistant metal film; 95 . . . Copper coating; 96 . . . Dry film resist.

What is claimed is:

1. A wiring substrate comprising a glass substrate having a through hole and a capacitor on a first surface of the glass substrate, wherein a bottom of the through hole on the first surface and the component forming the high-frequency circuit have an overlapping part on the first surface;

the capacitor comprises (a) a first conductive layer in direct contact with the first surface of the glass substrate over the through hole, (b) an insulator layer over and in direct contact with the first conductive layer and (c) a second conductive layer over and in direct contact with the insulator layer, the first conductive layer being flush and parallel with the first surface of the glass substrate.

2. The wiring substrate according to claim 1, wherein the through hole is filled with a material having a coefficient of thermal expansion (CTE) of 40 ppm/K or lower.

3. The wiring substrate of claim 1, wherein a diameter of an opening of the through hole on the first surface is smaller than a diameter of an opening of the through hole on a second surface opposite to the first surface.

4. The wiring substrate of claim 1, wherein the first conductive layer has a part with a greater thickness at the bottom of the through hole than at a part of the first conductive layer that does not overlap with the through hole.

5. The wiring substrate according to claim 1, further comprising (i) a third conductive layer on a side wall of the through hole and (ii) a dielectric material in a central part of the through hole, the dielectric material being surrounded by the third conductive layer and in direct contact with the third conductive layer.

6. A wiring substrate comprising (ii) a glass substrate having a through hole; (ii) a component forming a high-frequency circuit on a first surface of the glass substrate, (iii) a first conductive layer on a side wall of the through hole and (iv) a dielectric material in a central part of the through hole, the dielectric material being surrounded by the first conductive layer and in direct contact with the first conductive layer wherein a bottom of the through hole on the first surface and the component forming the high-frequency circuit have an overlapping part on the first surface.

7. The wiring substrate according to claim 6, wherein the through hole is filled with a material having a coefficient of thermal expansion (CTE) of 40 ppm/K or lower.

8. The wiring substrate of claim 6, wherein a diameter of an opening of the through hole on the first surface is smaller than a diameter of an opening of the through hole on a second surface opposite to the first surface.

9. The wiring substrate of claim 6, wherein a second conductive layer of the component forming the high-frequency circuit in contact with the first surface has a part with a greater thickness at the bottom of the through hole than at a part of the second conductive layer that does not overlap with the through hole.

10. The wiring substrate of claim 6, wherein the component forming the high-frequency circuit is a capacitor.

* * * * *